(12) United States Patent
Shimizu et al.

(10) Patent No.: US 8,262,946 B2
(45) Date of Patent: Sep. 11, 2012

(54) COLOR COMPOSITION FOR COLOR FILTER, COLOR FILTER USING THE COMPOSITION AND LIQUID CRYSTAL DISPLAY DEVICE

(75) Inventors: Mie Shimizu, Tokyo (JP); Koichi Minato, Tokyo (JP); Masaharu Takahashi, Takaishi (JP)

(73) Assignees: Toppan Printing Co., Ltd., Tokyo (JP); DIC Corportion, Tokyo (JP)

( * ) Notice: Subject to any disclaimer, the term of this patent is extended or adjusted under 35 U.S.C. 154(b) by 0 days.

(21) Appl. No.: 12/662,972

(22) Filed: May 13, 2010

(65) Prior Publication Data
US 2010/0295002 A1 Nov. 25, 2010

(30) Foreign Application Priority Data
May 15, 2009 (JP) .................. 2009-118643

(51) Int. Cl.
*G02B 5/23* (2006.01)
*G02F 1/1335* (2006.01)

(52) U.S. Cl. ........ 252/586; 349/106; 349/149; 362/293; 430/7; 430/18; 430/281.1

(58) Field of Classification Search ................. 252/586; 427/258, 333, 334; 430/281.1, 7, 18; 349/106, 349/149; 362/293
See application file for complete search history.

(56) References Cited

U.S. PATENT DOCUMENTS

| | | | |
|---|---|---|---|
| 7,291,361 B2* | 11/2007 | Ogino et al. | 427/258 |
| 2005/0112501 A1* | 5/2005 | Ikegami et al. | 430/281.1 |
| 2008/0269407 A1* | 10/2008 | Nishiguchi et al. | 524/592 |

FOREIGN PATENT DOCUMENTS

| | | |
|---|---|---|
| CN | 1496858 A | 5/2004 |
| CN | 101294015 A | 10/2008 |
| JP | 10-20485 | 1/1998 |
| JP | 2000-136253 | 5/2000 |
| JP | 2000-187114 | 7/2000 |
| JP | 2003-149810 | 5/2003 |
| JP | 2008-20905 | 1/2008 |
| JP | 2008-40486 | 2/2008 |
| KR | 10-2007-0117469 | 12/2007 |
| KR | 10-2008-0071942 | 8/2008 |

OTHER PUBLICATIONS

U.S. Office Action mailed Aug. 24, 2011 for parent U.S. Appl. No. 13/064,990.
U.S. Appl. No. 13/064,990, filed Apr. 29, 2011, Mie Shimizu, Toppan Printing Co., Ltd. and DIC Corporation.
Chinese Office Action dated Nov. 1, 2011 issued in corresponding Chinese Patent Application No. 101010180954.7.
Korean Office Action mailed Feb. 3, 2012 issued in corresponding Korean Patent Application No. 10-2010-0045204.
Notice of Allowance mailed from the Unites States Patent and Trademark Office on Apr. 20, 2012 in the related U.S. Appl. No. 13/064,990.

* cited by examiner

*Primary Examiner* — Bijan Ahvazi

(57) ABSTRACT

Disclosed is a color composition for a color filter, which includes at least acrylic resin and a coloring agent. The acrylic resin contains a copolymer formed of a first vinyl monomer having a benzyl group and a second vinyl monomer having a carboxyl group, the copolymer having a weight average molecular weight of 3,000 to 11,000, and an acid value of solid matter of the copolymer being confined to 30 to 85.

2 Claims, 1 Drawing Sheet

COLOR COMPOSITION FOR COLOR FILTER, COLOR FILTER USING THE COMPOSITION AND LIQUID CRYSTAL DISPLAY DEVICE

CROSS-REFERENCE TO RELATED APPLICATIONS

This application is based upon and claims the benefit of priority from prior Japanese Patent Application No. 2009-118643, filed May 15, 2009, the entire contents of which are incorporated herein by reference.

BACKGROUND OF THE INVENTION

1. Field of the Invention

This invention relates to a color composition for a color filter, to a color filter where this color composition is employed, and to a liquid crystal display device which is provided with this color filter.

2. Description of the Related Art

In recent years, thin display devices such as a liquid crystal display device are increasingly demanded to enhance the picture image and power-saving thereof and to lower the manufacturing cost thereof. Therefore, in the case of the color filter to be employed in such display devices, it is desired to employ a photosensitive color composition which is sufficiently high in color purity, in brightness and in contrast and makes it possible to produce a fine pattern accurately and at a low cost while developing the double refraction in conformity with various kinds of liquid crystal display modes.

Especially, with respect to the viewing angle characteristics of liquid crystal display device, it is now demanded to exhibit a very high level of display quality. More specifically, on displaying black color of liquid crystal (in the case of normally black display, the black color in field-off state), it is demanded to realize pure black color and to display this pure black color at a wide viewing angle. For this purpose, various ideas have been practiced attaching importance to the features of a retardation film, to the method of aligning the liquid crystal molecules and to the method of driving the liquid crystal molecules. Since the display of "black" to be dealt therewith is directly related with the value of contrast ratio on the occasion of ON/OFF of driving signals, the display thereof is important in this respect.

Further, there is such a high level of demand for the "black display" that even if there is a minute retardation (a retardation in thickness direction) which is caused to generate by each of color pixels constituting a color filter to be formed through the dispersion of organic pigments, it is demanded to make sure that the black display can be prevented from being badly influenced. In order to meet this demand, various methods have been tried to reduce the quantity of retardation that the color filter may exhibit, the methods including one wherein a macromolecule having a planar structural group on its side chain is introduced into a color layer constituting a color pixel, or one wherein a double refractive index-reducing particles having a double refraction which is opposite in sign to that of a macromolecule is introduced into a color layer constituting a color pixel (see for example, JP-A 2000-136253 and JP-A 2000-187114).

Further, there has been proposed an idea to incorporate a retardation-adjusting agent in the color layers of color filter, thus enabling each of subpixels to have a different retardation, thereby making it possible to enable the viewing angle compensation of black state of a liquid crystal display device to be effected in the wavelength of almost all visible light zone without necessitating the provision of a polymeric liquid crystal layer in addition to the color layers or without necessitating the change of thickness in each of subpixels (see for example, JP-A 2008-20905 and JP-A 2008-40486).

However, in the cases of the prior art wherein the double refractive index-reducing particles or the retardation-adjusting agent is employed, even if it is possible to adjust the retardation of a color polymer film formed a coated film, it has been found impossible to optimize the characteristics of color resist employed as a starting material for forming color pixels. Specifically, it has been found difficult to concurrently optimize not only the developing properties of a color resist at the step of photolithography, the adhesion of the color resist to a substrate and the storage stability of the color resist but also the adjustment of retardation.

Incidentally, it has been found out by the present inventors that the value of retardation in thickness direction which the color layer may exhibit greatly differs depending on the kinds of pigment to be employed and that the magnitude of the value of retardation in thickness direction becomes larger depending on the pulverization or dispersion of the pigment or on the kinds of matrix resin (for example, acrylic resin, cardo resin, etc.).

For these reasons, in the case of the conventional methods where double refractive index-reducing particles or the conventional retardation-adjusting agent is employed, even if it is possible to increase the value of retardation in thickness direction in the positive direction, it is difficult to shift the retardation of color layer existing in a plus region toward less than +2 nm or in the negative direction which is required for obtaining "black" of a higher level.

Meanwhile, with respect to the demand for contrast, although there has been proposed an idea of using acrylic resin comprising, as essential components, benzyl (metha)acrylate and (metha)acrylic acid (see for example, JP-A 10-20485), it is still impossible to realize the development of double refraction in conformity with each of various liquid crystal display modes.

BRIEF SUMMARY OF THE INVENTION

It is objects of the present invention to provide a color composition for a color filter, which is not only excellent in long-term storage stability, heat resistance and developing speed, but also suited for forming the color filter which is excellent in adhesion to a substrate, hardness, solvent resistance and alkali resistance, to provide a color filter which can be formed by making use of this color composition for a color filter and exhibits a value of retardation in thickness direction (Rth) which is necessary for obtaining a high level of black color in the off state display, and to provide a liquid crystal display device which is provided with this color filter and capable of greatly improving oblique visibility.

According to a first aspect of the present invention, there is provided a color composition for a color filter, which comprises at least acrylic resin and a coloring agent, wherein the acrylic resin contains a copolymer formed of a first vinyl monomer having a benzyl group and a second vinyl monomer having a carboxyl group, the first vinyl monomer having a function of regulating a retardation of a color layer obtained by curing of the color composition, the copolymer having a weight average molecular weight of 3000 to 11000, and an acid value of solid matter of the copolymer being confined to 30 to 85.

According to a second aspect of the present invention, there is provided a color filter which comprises: a substrate; and a color layer formed on the substrate and constituting color pixels of a plurality of colors, wherein the color layer is formed through a curing of a color composition comprising at least acrylic resin and a coloring agent, wherein the acrylic resin contains a copolymer formed of a first vinyl monomer having a benzyl group and a second vinyl monomer having a carboxyl group, the first vinyl monomer having a function of regulating a retardation of a color layer, the copolymer having a weight average molecular weight of 3000 to 11000 and an acid value of solid matter falling within the range of 30 to 85.

According to a third aspect of the present invention, there is provided a liquid crystal display device which is provided with the color filter of the second aspect of the present invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
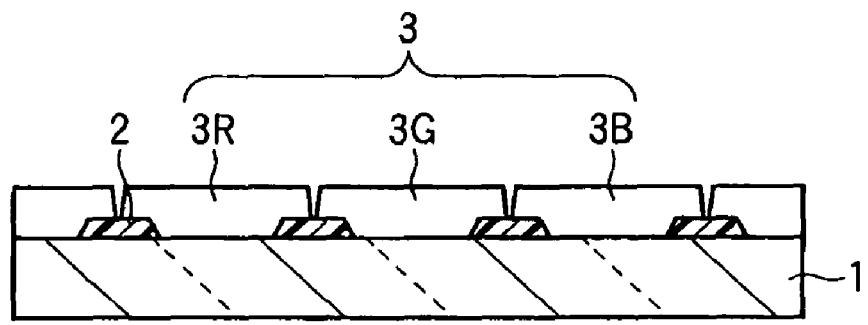
FIG. 1 is a cross-sectional view schematically illustrating the color filter according to one embodiment of the present invention.

Next, various embodiments of the present invention will be explained.

As a result of intensive studies made by the present inventors on the color composition for forming the color pixels of color filter, the following facts have been found out.

(1) A color composition containing a copolymer formed through copolymerization of a first vinyl monomer having benzyl group and a second vinyl monomer having carboxyl group is excellent in long-term storage stability and developing speed, and a color layer obtained by the curing of the color composition through the light exposure and/or baking thereof is enabled to give a value of retardation in thickness direction (Rth) ranging from +1 nm to −10 nm and is excellent in heat resistance, in adhesion to a substrate, in hardness, in solvent resistance and in alkali resistance.

(2) When color pixels are formed by means of a color filter-forming method using an alkali-soluble type photosensitive composition containing the aforementioned color composition, it is possible to form a pattern of color pixels at an optimum developing speed and with high accuracy.

The present invention is based on these findings.

Namely, the color composition according to the first embodiment of the present invention is featured in that it comprises acrylic resin, and an organic pigment, wherein the acrylic resin contains a copolymer formed through copolymerization of a first vinyl monomer having benzyl group and a second vinyl monomer having carboxyl group and having a weight average molecular weight of 3000 to 11000, an acid value of solid matter of the copolymer being confined to 30 to 85.

As described above, as long as the weight average molecular weight and the acid value of solid matter of the copolymer are confined within the aforementioned ranges, it is possible to provide the color composition with desirable developing properties and hence to form a pattern at an appropriate developing speed on forming color pixels by a method of forming a color filter using an alkali-soluble photosensitive composition.

Whereas, if the weight average molecular weight and the acid value of solid matter of the copolymer are not confined within the aforementioned ranges, i.e. if the aforementioned weight average molecular weight is less than 3000 or more than 11000, or if the aforementioned acid value of solid matter is less than 30 or more than 85, the viscosity of the color composition would be more likely to be increased with time and, furthermore, various undesirable problems would be likely to be caused to generate when an alkali-developing photosensitive composition containing the color composition containing is used, the problems including the deterioration of alkali-developing properties, thereby making it impossible to appropriately regulate the developing speed, thus resulting in the prolongation of developing time or resulting in too fast developing speed on the contrary so that the color pixels may be easily peeled off from the surface of substrate.

Further, the first vinyl monomer having benzyl group is provided with a retardation-regulating function acting to the color layer formed through the curing of the color composition. Because of this, the color composition according to this embodiment is capable of securing not only excellent developing properties and stability but also a desired retardation in thickness direction value (Rth).

In this case, in order to eliminate a redundant positive retardation in thickness direction value (Rth) of about 3 to +30 nm that has been generated due to the influence of a pigment, a dispersing agent and other kinds of binder resin and also to reduce the value Rth toward a negative value, the acrylic resin may preferably contain the vinyl monomer having benzyl group at a ratio of 76 mol % to 91 mol % based on the solid matters of acrylic resin. By doing so, it is now possible to confine the retardation in thickness direction value (Rth) of the color layer to the range of +1 to −10 nm that has been essentially desired, thereby making it possible to provide a liquid crystal display device which is excellent in display properties even when the display is viewed obliquely.

Namely, when the content of the vinyl monomer having benzyl group is not less than 76 mol %, it is possible to sufficiently eliminate the positive retardation in thickness direction value (Rth) of about 3 to +30 nm and to enable the acrylic resin to easily exhibit the function thereof as a double refraction-regulating agent. Further, when the content of the vinyl monomer having benzyl group is not more than 91 mol %, it is possible to suppress the viscosity increase with time of the color composition.

Moreover, in order to secure a desired retardation in thickness direction value, the copolymer of a first vinyl monomer having benzyl group and a second vinyl monomer having carboxyl group contained in the acrylic resin may preferably be selected from those having a weight average molecular weight of 2,000 to 13,000. However, in order to secure not only the aforementioned developing properties but also the aforementioned stability of the color composition, the weight average molecular weight thereof may more preferably be confined to 3,000 to 11,000.

Incidentally, "Rth" herein is a value represented by a formula of: Rth={(Nx+Ny)/2−Nz}×d; wherein Nx is a refractive index in the x-direction in the plane of a cured film; Ny is a refractive index in the y-direction in the plane of a cured film; and Nz is a refractive index in the thickness direction of the cured film. Herein, x-direction is defined as a slow axis represented by Nx≧Ny; and d is a thickness (nm) of the cured film. In the liquid crystal display device, this Rth represents a criterion in determining if the display properties thereof are excellent even when the display is viewed obliquely.

Next, the essential components and optional components of the color composition according to this embodiment will be respectively explained in detail.

(Acrylic Resin)

The acrylic resin to be used as an essential component of the color composition according to this embodiment can be obtained through a reaction using various methods such as the radical polymerization between the ethylenic unsaturated group of a first vinyl monomer having benzyl group and the ethylenic unsaturated group of a second vinyl monomer having carboxyl group in an organic solvent. Incidentally, the first vinyl monomer having benzyl group is provided with a retardation-regulating function acting to the color layer formed through the curing of the color composition.

Examples of such a first vinyl monomer having benzyl group include benzyl acrylate and benzyl methacrylate.

Examples of the second vinyl monomer having carboxyl group include, for example, acrylic acid, methacrylic acid, maleic acid, monoalkyl maleic acid, fumaric acid, monoalkyl fumaric acid, itaconic acid, monoalkyl itaconic acid, crotonic acid, maleic anhydride, itaconic anhydride, 2-methacryloyl propionic acid, etc. Among them, acrylic acid and methacrylic acid are more preferable for use.

In order to obtain the acrylic resin to be used in this embodiment, it is also possible to co-use, as an additional vinyl monomer other than the aforementioned vinyl monomers, acrylates such as alkyl(metha)acrylate including methyl (metha)acrylate, ethyl (metha)acrylate, propyl (metha)acrylate, butyl (metha)acrylate, t-butyl (metha)acrylate, benzyl (metha)acrylate, lauryl(metha)acrylate, etc.; hydroxyl group-containing (metha)acrylate such as hydroxyethyl (metha)acrylate, hydroxypropyl(metha)acrylate, etc.; ether-containing (metha)acrylate such as ethoxyethyl (metha)acrylate, glycidyl(metha)acrylate, etc.; and alicyclic (metha)acrylate such as cyclohexyl (metha)acrylate, isobornyl (metha)acrylate, dicyclopentenyl(metha)acrylate, etc., these acrylates being co-polymerized together with the aforementioned vinyl monomers.

Incidentally, these vinyl monomers can be used singly or in combination of two or more kinds.

Further, other kinds of compounds which can be co-polymerized together with these acrylates such as styrene, cyclohexyl maleimide, phenyl maleimide, etc. can be co-used.

Furthermore, it is possible to obtain a photosensitive resin by reacting a compound having epoxy group and an unsaturated double bond such as glycidyl methacrylate with a resin that can be obtained through the copolymerization of carboxylic acid having ethylenic unsaturated group such as (metha)acrylic acid, or by addition-reacting carboxylic acid-containing compound such as (metha)acrylic acid with a resin to be obtained through the monopolymerization of epoxy-containing (metha)acrylate such as glycidyl methacrylate or through the copolymerization of the epoxy-containing (metha)acrylate and other kinds of (metha)acrylate.

It is also possible to obtain a photosensitive resin through the reaction between a resin having hydroxyl group and constituted by a monomer such as hydroxyethyl methacrylate and a compound having isocyanate and an ethylenic unsaturated group such as methacryloyloxyethyl isocyanate.

Further, the color composition can be formed into a photocurable color composition for a color filter by incorporating therein a photo-polymerizable monomer or a photo-polymerization initiator as described hereinafter.

As described above, the resin to be obtained through the copolymerization of hydroxyethyl methacrylate, etc. and having a plurality of hydroxyl groups may be reacted with a polybasic acid anhydride to introduce carboxyl group, thereby obtaining a resin having carboxyl group. The manufacturing method of such a resin is not limited to the aforementioned methods.

As for specific examples of the acid anhydride to be employed in the aforementioned reactions, they include, for example, malonic anhydride, succinic anhydride, maleic anhydride, itaconic anhydride, phthalic anhydride, tetrahydrophthalic anhydride, hexahydrophthalic anhydride, methyltetrahydrophthalic anhydride, trimellitic anhydride, etc.

As for specific examples of the photopolymerizable monomer, they include various kinds of acrylic esters and methacrylic esters such as 2-hydroxyethyl(metha)acrylate, 2-hydroxypropyl(metha)acrylate, cyclohexyl(metha)acrylate, polyethyleneglycol di(metha)acrylate, pentaerythritol tri (metha)acrylate, trimethylolpropane tri(metha)acrylate, dipentaerythritol hexa(metha)acrylate, tricyclodecanyl (metha)acrylate, melamine (metha)acrylate, epoxy(metha) acrylate, etc.; (metha)acrylic acid; styrene; vinyl acetate; (metha)acryl amide; N-hydroxymethyl (metha)acryl amide; acrylonitrile; etc.

Further, it is preferable to employ polyfunctional urethane acrylate having (metha)acryloyl group which can be obtained through the reaction between (metha)acrylate having hydroxyl group and polyfunctional isocyanate. Incidentally, the combination between the (metha)acrylate having hydroxyl group and polyfunctional isocyanate may be optionally selected and hence there is not any particular limitation. Further, only one kind of polyfunctional urethane acrylate may be used singly or in a combination of two or more kinds thereof.

(Non-Photosensitive Resin and/or Photosensitive Resin)

The color composition according to this embodiment may be constructed such that it includes, together with acrylic resin, a non-photosensitive resin and/or a photosensitive resin preferably exhibiting a permeability of not less than 80%, more preferably not less than 95% in a total wavelength range of 400 to 700 nm of visible light zone.

As for specific examples of the transparent resin, it is possible to employ thermoplastic resin, thermosetting resin and photosensitive resin. Examples of the thermoplastic resin include, for example, butyral resin, styrene-maleic acid copolymer, chlorinated polyethylene, chlorinated polypropylene, polyvinyl chloride, vinyl chloride-vinyl acetate copolymer, polyvinyl acetate, polyurethane resin, polyester resin, acrylic resin, alkyd resin, polystyrene, polyamide resin, rubber type resin, cyclized rubber-based resin, celluloses, polybutadien, polyethylene, polypropylene, polyimide, etc. Examples of the thermosetting resin include, for example, epoxy resin, benzoguanamine resin, rosin-modified maleic resin, rosin-modified fumaric acid resin, melamine resin, urea resin, phenol resin, etc.

(Coloring Agents)

As for the coloring agent to be used in the color composition according to this embodiment, there is not any limitation with regard to the color tone and hence the coloring agent may be appropriately selected depending on the intended use of the color filter to be obtained. Namely, the coloring agent may be optionally selected from pigments, dyes and natural coloring matters.

Since the color filter is required to exhibit very high definition coloring and heat resistance, the coloring agents to be employed in this embodiment may preferably be selected from those excellent in coloring properties and in heat resistance or especially from those which are high in thermal decomposition resistance. Organic pigments or inorganic pigments may be preferably employed as the coloring agents. Especially preferable coloring agents useful in this embodiment are organic pigments and carbon black.

With respect to specific examples of the organic pigments, they include, for example, compounds which are classified as pigments in the color index. More specifically, the compounds which are identified by the following color index (C.I.) numbers.

Namely, they include C.I. Pigment Yellow 12, C.I. Pigment Yellow 13, C.I. Pigment Yellow 14, C.I. Pigment Yellow 17, C.I. Pigment Yellow 20, C.I. Pigment Yellow 24, C.I. Pigment Yellow 31, C.I. Pigment Yellow 55, C.I. Pigment Yellow 83, C.I. Pigment Yellow 93, C.I. Pigment Yellow 109, C.I. Pigment Yellow 110, C.I. Pigment Yellow 138, C.I. Pigment Yellow 139, C.I. Pigment Yellow 150, C.I. Pigment Yellow 153, C.I. Pigment Yellow 154, C.I. Pigment Yellow 155, C.I. Pigment Yellow 166, C.I. Pigment Yellow 168, C.I. Pigment Yellow 180, C.I. Pigment Yellow 211;

C.I. Pigment Orange 5, C.I. Pigment Orange 13, C.I. Pigment Orange 14, C.I. Pigment Orange 24, C.I. Pigment Orange 34, C.I. Pigment Orange 36, C.I. Pigment Orange 38, C.I. Pigment Orange 40, C.I. Pigment Orange 43, C.I. Pigment Orange 46, C.I. Pigment Orange 49, C.I. Pigment Orange 61, C.I. Pigment Orange 64, C.I. Pigment Orange 68, C.I. Pigment Orange 70, C.I. Pigment Orange 71, C.I. Pigment Orange 72, C.I. Pigment Orange 73, C.I. Pigment Orange 74;

C.I. Pigment Red 1, C.I. Pigment Red 2, C.I. Pigment Red 5, C.I. Pigment Red 17, C.I. Pigment Red 31, C.I. Pigment Red 32, C.I. Pigment Red 41, C.I. Pigment Red 122, C.I. Pigment Red 123, C.I. Pigment Red 144, C.I. Pigment Red 149, C.I. Pigment Red 166, C.I. Pigment Red 168, C.I. Pigment Red 170, C.I. Pigment Red 171, C.I. Pigment Red 175, C.I. Pigment Red 176, C.I. Pigment Red 177, C.I. Pigment Red 178, C.I. Pigment Red 179, C.I. Pigment Red 180, C.I. Pigment Red 185, C.I. Pigment Red 187, C.I. Pigment Red 202, C.I. Pigment Red 206, C.I. Pigment Red 207, C.I. Pigment Red 209, C.I. Pigment Red 214, C.I. Pigment Red 220, C.I. Pigment Red 221, C.I. Pigment Red 224, C.I. Pigment Red 242, C.I. Pigment Red 243, C.I. Pigment Red 254, C.I. Pigment Red 255, C.I. Pigment Red 262, C.I. Pigment Red 264, C.I. Pigment Red 272;

C.I. Pigment Violet 1, C.I. Pigment Violet 19, C.I. Pigment Violet 23, C.I. Pigment Violet 29, C.I. Pigment Violet 32, C.I. Pigment Violet 36, C.I. Pigment Violet 38;

C.I. Pigment Blue 15, C.I. Pigment Blue 15:3, C.I. Pigment Blue 15:4, C.I. Pigment Blue 15:6, C.I. Pigment Blue 60, C.I. Pigment Blue 80;

C.I. Pigment Green 7, C.I. Pigment Green 36, C.I. Pigment Green 58;

C.I. Pigment Brown 23, C.I. Pigment Brown 25;

C.I. Pigment Black 1, C.I. Pigment Black 7.

These organic pigments can be used after refining them by means of, for example, a sulfuric acid re-crystallization method, a solvent washing method, a salt-milling method or a combination thereof.

Among these organic pigments, it is more preferable to employ at least one kind of organic pigments selected from the group consisting of C.I. Pigment Yellow 83, C.I. Pigment Yellow 139, C.I. Pigment Yellow 138, C.I. Pigment Yellow 150, C.I. Pigment Yellow 180, C.I. Pigment Red 166, C.I. Pigment Red 177, C.I. Pigment Red 242, C.I. Pigment Red 254, C.I. Pigment Blue 15:3, C.I. Pigment Blue 15:4, C.I. Pigment Blue 15:6, C.I. Pigment Green 7, Pigment Green 36, C.I. Pigment Green 58, C.I. Pigment Violet 23, C.I. Pigment Blue 60 and C.I. Pigment Blue 80.

Although there is not any particular limitation with regard to the mixing ratio of the pigment, the pigment may preferably be incorporated at a ratio of 5-70% by weight based on a total quantity (100% by weight) of the color composition. More preferably, the pigment may be incorporated at a ratio of about 5-50% by weight, most preferably about 20-50% by weight, the balance being substantially constituted by a resinous binder that can be provided by a pigment carrier.

Further, for the purpose of spectral adjustment of color filter, these coloring agents may be used in combination of two or more kinds thereof. These coloring agents may be incorporated in the color composition at a ratio of 5-70% by weight based on a total quantity (100% by weight) of the solid matters of the color composition.

Further, in order to secure excellent coating properties, sensitivity, developing properties while making it possible to retain balance between the chroma and brightness, the aforementioned organic pigments may be used in combination with inorganic pigments. As for the inorganic pigments, it is possible to employ metal oxide powder, metal sulfide powder or metal powder such as yellow lead, zinc yellow, red iron oxide (III), cadmium red, ultramarine blue, Prussian blue, chromium oxide green, cobalt green, etc. For the purpose of toning, the color composition may further contain dyes within the limits which do not deteriorate the heat resistance of the color composition.

(Dispersing Agent)

When the pigment is dispersed in a pigment carrier and in an organic solvent, a dispersing agent or a surfactant is required to be used for the dispersion of the pigment. With respect to the dispersing agent, it is possible to employ a surfactant, an intermediate of pigment, an intermediate of dye, a Solsperse, etc. These dispersing agents are respectively provided with not only a pigment affinity moiety exhibiting pigment-adsorbing properties, but also another moiety exhibiting compatibility to a pigment carrier, thereby enabling the dispersing agents to adsorb onto the pigment and to stabilize the dispersion of the pigment in the pigment carrier.

As for specific examples of the dispersing agent, they include polyurethane, polycarboxylate such as polyacrylate, unsaturated polyamide, polycarboxylic acid, (partial) amine polycarboxylate, ammonium polycarboxylate, alkyl amine polycarboxylate, polysiloxane, long chain polyaminoamide phosphate, hydroxyl group-containing polycarboxylate and modified compounds thereof, an oily dispersing agent such as amide to be formed through a reaction between poly(lower alkyl imine) and polyester having a free carboxyl group and salts of the amide, (metha)acrylic acid-styrene copolymer, (metha)acrylic acid-(metha)acrylate copolymer, styrene-maleic acid copolymer, water-soluble resin or water-soluble macromolecular compound such as polyvinyl alcohol and poly(vinyl pyrrolidone), polyester compounds, modified polyacrylate compounds, ethylene oxide/propylene oxide adduct, phosphate, etc. These compounds may be employed individually or in combination of two or more kinds.

These dispersing agents are available on the market. Specific examples of them include, for example, Disperbyk-2000 and Disperbyk-2001 (all available from BigChemy (BYK) Co., Ltd.) each representing a modified acrylic copolymer;

Disperbyk-161, Disperbyk-162, Disperbyk-165, Disperbyk-167, Disperbyk-170, Disperbyk-182 (all available from BigChemy (BYK) Co., Ltd.), SOLSPERSE-76500 (available from Lubrizole Co., Ltd.) each representing polyurethane; SOLSPERSE-24000, SOLSPERSE-37500 (all available from Lubrizole Co., Ltd.), Ajisper PB821, Ajisper PB822, Ajisper PB880 (all available from Ajinomoto Fine Techno Co., Ltd.) each representing a cationic tandem type graft polymer.

Although there is not any particular limitation with regard to the mixing ratio of the dispersing agent, it is preferable to incorporate the dispersing agent at a ratio of 1 to 10% by weight based on 100% by weight of the quantity of pigments. Further, The color composition may preferably be formulated such that bulky particles 5 μm or more in size, preferably, bulky particles 1 μm or more in size, more preferably, bulky particles 0.5 μm or more in size as well as dusts intermingled therein are completely removed from the composition by making use of centrifugal separation, sintered filter, membrane filter, etc.

(Surfactants)

As for the surfactant, it is possible to employ an anionic surfactant such as polyoxyethylene alkylether sulfate, dodecylbenzene sodium sulfonate, alkali salts of styrene-acrylic acid copolymer, alkylnaphthaline sodium sulfonate, alkyldiphenyl ether sodium disulfonate, monoethanol amine lauryl sulfate, triethanol amine lauryl sulfate, ammonium lauryl sulfate, monoethanol amine stearate, sodium stearate, sodium lauryl sulfate, monoethanol amine of styrene-acrylic acid copolymer, polyoxyethylene alkylether phosphate, etc.; a nonionic surfactant such as polyoxyethylene oleyl ether, polyoxyethylene lauryl ether, polyoxyethylene nonylphenyl ether, polyoxyethylene alkylether phosphate, polyoxyethylene sorbitan monostearate, polyethyleneglycol monolaurate, etc.; cationic surfactant such as alkyl quaternary ammonium salt and an ethylene oxide adduct thereof, etc.; and an amphoteric surfactant such as alkyl betaine such as betaine alkyldimethyl aminoacetate, alkylimidazoline, etc. These surfactants can be employed singly or in combination of two or more kinds.

(Photo-Polymerization Initiators)

As for specific examples of the photo-polymerization initiator, they include an acetophenone-based compound such as 4-phenoxy dichloroacetophenone, 4-t-butyl-dichloroacetophenone, diethoxyacetophenone, 1-(4-isopropylphenyl)-2-hydroxy-2-methylpropan-1-one, 1-hydroxycyclohexylphenyl ketone, 2-benzyl-2-dimethylamino-1-(4-morpholinophenyl)-butan-1-one; a benzoin-based compound such as benzoin, benzoin methyl ether, benzoin ethyl ether, benzoin isopropyl ether, benzyldimethyl ketal, etc.; a benzophenone-based compound such as benzophenone, benzoylbenzoic acid, benzoylmethyl benzoate, 4-phenyl benzophenone, hydroxybenzophenone, acrylated benzophenone, 4-benzoyl-4'-methyldiphenyl sulfide, etc.; a thioxanthone-based compound such as thioxanthone, 2-chlorothioxanthone, 2-methylthioxanthone, isopropylthioxanthone, 2,4-diisopropylthioxanthone, etc.; a triazine-based compound such as 2,4,6-trichloro-s-triazine, 2-phenyl-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-piperonyl-4,6-bis(trichloromethyl)-s-triazine, 2,4-bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2,4-trichloromethyl-(piperonyl)-6-triazine, 2,4-trichloromethyl(4'-methoxystyryl)-6-triazine, etc.; an O-acyloxime-based compound such as 1-[4-(phenylthio)-2-(O-benzoyloxime)], O-(acetyl)-N-(1-phenyl-2-oxo-2-(4'-methoxynaphthyl)ethylidene)hydroxylamine, 1-[4-(phenylthio)phenyl]-heptan-1,2-dione-2-(O-benzoyloxime), 1-[4-(phenylthio)phenyl]-octan-1,2-dione-2-(O-benzoyloxime), 1-[4-(benzoyl)phenyl]-octan-1,2-dione-2-(O-benzoyloxime), 1-[9-ethyl-6-(2-methylbenzoyl)-9H-carbazol-3-yl]-ethanone-1-(O-acetyloxime), 1-[9-ethyl-6-(3-methylbenzoyl)-9H-carbazol-3-yl]-ethanone-1-(O-acetyloxime), 1-(9-ethyl-6-benzoyl-9.H.-carbazol-3-yl]-ethanone-1-(O-acetyloxime), ethanone-1-[9-ethyl-6-(2-methyl-4-tetrahydrofuranylbenzoyl)-9.H.-carbazol-3-yl]-1-(O-acetyloxime), ethanone-1-[9-ethyl-6-(2-methyl-4-tetrahydropyranylbenzoyl)-9.H.-carbazol-3-yl]-1-(O-acetyloxime), ethanone-1-[9-ethyl-6-(2-methyl-5-tetrahydrofuranylbenzoyl)-9.H.-carbazol-3-yl]-1-(O-acetyloxime), ethanone-1-[9-ethyl-6-(2-methyl-5-tetrahydropyranylbenzoyl)-9.H.-carbazol-3-yl]-1-(O-acetyloxime), ethanone-1-[(9-ethyl-6-{(2-methyl-4-(2,2-dimethyl-1,3-dioxoranyl)benzoyl]-9.H.-carbazol-3-yl]-1-(O-acetyloxime), ethanone-1-[9-ethyl-6-(2-methyl-4-tetrahydrofuranylmethoxybenzoyl)-9.H.-carbazol-3-yl]-1-(O-acetyloxime), ethanone-1-[9-ethyl-6-(2-methyl-4-tetrahydropyranylmethoxybenzoyl)-9.H.-carbazol-3-yl]-1-(O-acetyloxime), ethanone-1-[9-ethyl-6-(2-methyl-5-tetrahydrofuranylmethoxybenzoyl)-9.H.-carbazol-3-yl]-1-(O-acetyloxime), ethanone-1-[9-ethyl-6-(2-methyl-5-tetrahydropyranylmethoxybenzoyl)-9.H.-carbazol-3-yl]-1-(O-acetyloxime), ethanone-1-[9-ethyl-6-{2-methyl-4-(2,2-dimethyl-1,3-dioxoranyl)methoxybenzoyl}-9.H.-carbazol-3-yl]-1-(O-acetyloxime), etc.; a phosphine-based compound such as bis(2,4,6-trimethylbenzoyl)phenylphosphine oxide, 2,4,6-trimethylbenzoyl diphenylphosphine oxide, etc.; a quinone-based compound such as 9,10-phenanthrene quinone, camphor quinone, ethyl anthraquinone, etc.; a borate-based compound; a carbazol-based compound; an imidazole-based compound, titanocene-based compound, etc. Among these O-acyloxime-based compounds, especially preferable examples thereof include 1-[4-(phenylthio)phenyl]-octan-1,2-dione-2-(O-benzoyloxime), 1-[9-ethyl-6-(2-methylbenzoyl-9.H.-carbazol-3-yl]-ethanone-1-(O-acetyloxime), ethanone-1-[9-ethyl-6-(2-methyl-4-tetrahydrofuranyl methoxybenzoyl)-9.H.-carbazol-3-yl]-1-(O-acetyloxime), ethanone-1-[9-ethyl-6-{2-methyl-4-(2,2-dimethyl-1,3-dioxoranyl)methoxybenzoyl}-9.H.-carbazol-3-yl]-1-(O-acetyloxime), etc. These photo-polymerization initiators can be employed singly or in combination of two or more kinds thereof.

(Photo-Sensitizer)

It is preferable to use these photo-polymerization initiators in combination with a photo-sensitizer. Specific examples of the photo-sensitizer include α-acyloxy ester, acylphosphine oxide, methylphenyl glyoxylate, benzyl, 9,10-phenanthrene quinone, camphor quinone, ethylanthraquinone, 4,4'-diethyl isophthalophenone, 3,3',4,4'-tetra(t-butyl peroxycarbonyl) benzophenone, 4,4'-diethyl aminobenzophenone, etc.

These sensitizers can be employed at a ratio of 0.1 to 60 parts by weight based on 100 parts by weight of the photo-polymerization initiator.

(Solvents)

The color composition according to this embodiment may further contain a solvent such as water, organic solvents, etc. for enabling the color composition to be uniformly coated on the surface of a substrate. Further, in the case where the color composition according to this embodiment is to be used for constituting the color layer of color filter, the solvent acts to enable pigments to be uniformly dispersed in the color layer. Specific examples of the solvent include, for example, cyclohexanone, ethyl Cellosolve acetate, butyl Cellosolve acetate, 1-methoxy-2-propyl acetate, diethyleneglycol dimethyl ether, ethyl benzene, ethyleneglycol diethyl ether, xylene, ethyl Cellosolve, methyl-n amyl ketone, propyleneglycol monomethyl ether, toluene, methylethyl ketone, ethyl acetate, methanol, ethanol, isopropyl alcohol, butanol, isobutyl ketone, petroleum solvent, etc. These solvents may be employed singly or in combination of two or more kinds.

The mixing ratio of these solvents may be confined to the range of 800 to 4,000 parts by weight, preferably 1,000 to 2,500 parts by weight based on 100 parts by weight of the pigments in the color composition.

(Method of Preparing Color Composition)

The color composition according to this embodiment can be prepared by way of any conventional method. For example, a photosensitive color composition containing a photo-polymerizable monomer, acrylic resin, a coloring agent, a dispersing agent and a solvent may be prepared according to the following methods.

(1) A pigment composition that has been prepared in advance through the mixing of a coloring agent with a dispersing agent is added to and dispersed in a mixture of a photo-polymerizable monomer and acrylic resin or in a solution obtained by dissolving these components in a solvent. Then, residual components are added to the resultant dispersion.

(2) A coloring agent and a dispersing agent are individually added to and dispersed in a mixture of a photo-polymerizable monomer and acrylic resin or in a solution obtained by dissolving these components in a solvent. Then, residual components are added to the resultant dispersion.

(3) A coloring agent is added to and dispersed in a mixture of a photo-polymerizable monomer and acrylic resin or in a solution obtained by dissolving these components in a solvent. Then, a dispersing agent is added to the resultant solution and then residual components are added to the resultant dispersion.

(4) Two kinds of mixtures each containing a photo-polymerizable monomer and acrylic resin or two kinds of solutions each obtained by dissolving these components in a solvent are prepared in advance and then a coloring agent and a dispersing agent are separately dispersed in aforementioned two kinds of materials. Then, these dispersions are mixed together and then residual components are added to the resultant dispersion. Incidentally, either the coloring agent or the dispersing agent may be dissolved only in the solvent.

Herein, the dispersion of the coloring agent and the dispersing agent in a mixture of a photo-polymerizable monomer and acrylic resin or in a solution obtained by dissolving these components in a solvent may be performed by making use of various kinds of dispersing apparatus such as a triple roll mill, a twin-roll mill, a sand mill, a kneader, a dissolver, a high-speed mixer, a homomixer, an attritor, etc. Further, in order to execute the dispersion more preferably, the dispersion may be performed with addition of various kinds of surfactant.

Although, when a color composition is prepared using a pigment composition obtained by mixing a coloring agent and a dispersing agent, the mixing may be performed by simply mixing a powdery coloring agent with a powdery dispersing agent, it is more preferable to employ the following mixing methods, i.e. (a) a mechanical mixing method using various kinds of grinders such as a kneader, a roll, an attritor, a super mill, etc.; (b) a method wherein a pigment is dispersed in a solvent to obtain a dispersion to which a solution containing a dispersing agent is added, thereby enabling the dispersing agent to be adsorbed onto the surface of pigment; (c) a method wherein a pigment and a dispersing agent are co-dissolved in a solvent exhibiting a strong dissolving power such as sulfuric acid and then co-precipitation is executed by making use of a poor solvent such as water, etc.

Next, there will be explained about the color filter according to a second embodiment of the invention wherein the color composition according to the first embodiment of the present invention explained above is employed.

FIG. 1 is a cross-sectional view schematically illustrating the color filter according to the second embodiment of the present invention.

As shown in FIG. 1, a black matrix 2 which is obtained through the patterning of a metal layer made of chromium or a photo-sensitive black resin composition is formed on the surface of a substrate 1 by means of the conventional method. As for the substrate 1 to be employed herein, it is preferable to use a transparent substrate such as a glass substrate or a resinous substrate made of polycarbonate, poly-methyl methacrylate, polyethylene phthalate, etc. Further, for the purpose of driving the liquid crystal molecules after the fabrication of a liquid crystal panel, a transparent electrode consisting of a combination of metal oxides such as indium oxide, tin oxide, zinc oxide, gallium oxide and antimony oxide may be formed on the surface of a glass plate or a resinous plate.

First of all, the color composition according to one embodiment of the present invention is uniformly coated on the surface of the substrate 1 by any desired coating method such as spray coating, spin coating, roll coating, etc., thereby forming a layer, which is then dried to form a color composition layer. Then, by means of photolithography, the color composition layer thus formed is subjected to a patterning process. Namely, the color composition layer is exposed to the irradiation of an active energy beam such as ultraviolet rays, electron beam, etc. through a photomask having a desired light-shielding pattern and then the resultant color composition layer is subjected to a developing process by making use of a developing solution such as an organic solvent or an alkali aqueous solution. As a result of this exposure process, the photo-polymerizable monomer located on the regions irradiated with the active energy beam is allowed to polymerize and cure. Further, when the color composition contains a photosensitive resin, this photosensitive resin is allowed to cross-link and cure.

Further, in order to enhance the exposure sensitivity, a water-soluble or alkali-soluble resin (for example, polyvinyl alcohol or a water-soluble acrylic resin) may be coated, prior to the step of exposure, on the surface of the coated photosensitive color composition and dried, thereby forming a film which is capable of suppressing the effects of oxygen to obstruct the polymerization.

In the step of the development, the portions of the color composition layer which are not irradiated with the active energy beam is washed out by making use of a developing solution to obtain a desired pattern. As for the method of developing treatment, it is possible to employ a shower developing method, a spray developing method, a dip developing method, a paddle developing method, etc. Incidentally, with respect to the developing solution, an alkali developing solution such as an aqueous solution of sodium carbonate, sodium hydroxide, etc. or an organic alkaline solution such as dimethylbenzyl amine, triethanol amine, etc. may be mainly employed. Further, if required, the developing solution may contain a defoaming agent or a surfactant.

Thereafter, the resultant layer thus developed is baked, and the same procedures as described above are repeated for other colors, thus manufacturing a color filter. More specifically, color pixels 3 consisting of red color pixels 3R, green color pixels 3G and blue color pixels 3B are formed on the surface of substrate 1 having a black matrix 2 formed thereon. Moreover, in order to make uniform the cell gap of liquid crystal display device, a spacer (not shown) may be formed on these color pixels 3.

Next, there will be explained about the liquid crystal display device according to a third embodiment of the invention wherein the color filter according to the second embodiment of the present invention explained above is employed.

Figure 2:
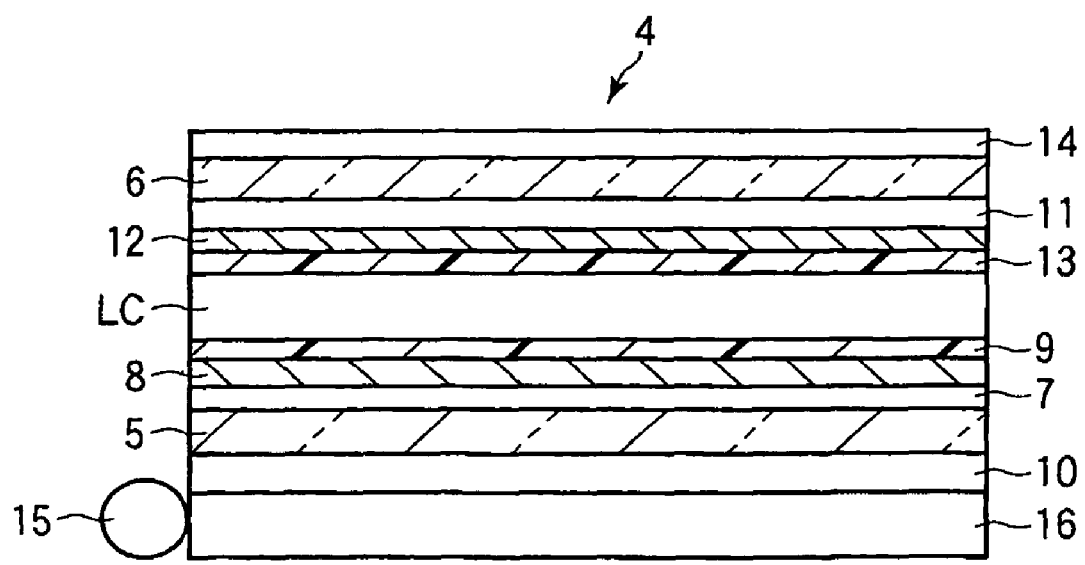
FIG. 2 is a cross-sectional view schematically illustrating one example of a liquid crystal display device which is provided with a color filter of the present invention.

FIG. 2 is a cross-sectional view schematically illustrating the liquid crystal display device according to a third embodiment of the present invention.

The liquid crystal display device 7 shown in FIG. 2 illustrates a typical example of a TFT drive type liquid crystal display device for use in a notebook-sized personal computer. This liquid crystal display device 4 is provided with a pair of transparent substrates 5 and 6, which are arranged face to face with a gap interposed therebetween. The gap between them is filled with a LC (liquid crystal).

The liquid crystal display device according to this embodiment of the invention can be applied to various liquid crystal alignment modes such as TN (Twisted Nematic), STN (Super Twisted Nematic), IPS (In-Plane switching), VA (Vertical Alignment), OCB (Optically Compensated Birefringence), etc.

On the inner surface of the first transparent substrate 5, there is formed a TFT (thin film transistor) array 7. On this TFT array 7 is deposited a transparent electrode layer 8 formed of ITO for example. On this transparent electrode layer 8 is further provided an alignment layer 9. Further, a polarizer (polarizing plate) 10 comprising a retardation film is formed on the outer surface of the transparent substrate 5.

On the other hand, on the inner surface of the second-transparent substrate 6, there is formed a color filter 11 shown in FIG. 1. The filter segments of red pixels, green pixels and blue pixels constituting the color filter 11 are separated from each other by a black matrix (not shown). If required, a transparent protective film (not shown) may be formed so as to cover the color filter 11. Furthermore, a transparent electrode layer 12 consisting of ITO for example is formed on this protective film. An alignment layer 13 is deposited so as to cover the transparent electrode layer 12. Further, a polarizer 14 is formed on the outer surface of the transparent substrate 6. Incidentally, a back light unit 16 equipped with a triple wavelength lamp 15 is disposed below the polarizer 10. The triple wavelength lamp employed as a light source may be replaced by a light-emitting diode or by an organic EL device.

EXAMPLES

Although the present invention will be explained below by referring to specific examples of the present invention and to comparative examples, it may not be construed that the present invention is limited to these examples. Further, since the materials to be employed in these examples are very sensitive to light, it may be required to prevent the sensitization of the materials by redundant light such as natural light, so that every works were performed under the yellow or red lamp. Incidentally, "part(s)" in the following examples and comparative examples means "weight part(s)". Further, the symbols of pigments are indicated by a color index number. For example, "PG36" means "C.I. Pigment Green 36", and "PY150" means "C.I. Pigment Yellow 150".

(Preparation of Resinous Solutions)

The polymer compositions to be employed in Examples and Comparative Examples were prepared as follows by making use of a first vinyl monomer having benzyl group and a second vinyl monomer having carboxyl group. The weight average molecular weight of the polymer compositions in the present invention was a weight average molecular weight reduced as polystyrene and measured by means of gel permeation chromatography. More specifically, the weight average molecular weight can be determined based on a calibration curve which is prepared by making use of standard polystyrene exhibiting monodispersion indicating 1 (actually, not more than 1.10) in the ratio (degree of dispersion) between a weight average molecular weight (Mw) and a number average molecular weight (Mn), wherein the molecular weight of a sample measured by making use of a gel permeation chromatography device is allocated to the molecular weight in the calibration curve. The weight average molecular weight (Mw) can be calculated according to the following calculation formula. Incidentally, the weight average molecular weight that has been detected by making use of a data processing apparatus is generally employed.

$$\text{Weight average molecular weight}(Mw) = \Sigma(Wi \times Mi)/W = \Sigma(Hi \times Mi)/\Sigma Hi$$

(wherein W is a total weight of a polymer; Wi is a weight of the "i"th polymer; Mi is a molecular weight at the "i"th elution time; and Hi is a height at the "i"th elution time)

Followings are details of the measuring apparatus and measuring conditions.

Measuring apparatus (Gel permeation chromatography)
Apparatus: HLC-8220GPC (Tohso Co., Ltd.)
Columns used:
  TSKgel G2000H$_{XL}$ (Tohso Co., Ltd.) (Column 1)
  TSKgel G3000H$_{XL}$ (Tohso Co., Ltd.) (Column 2)
  TSKgel G4000H$_{XL}$ (Tohso Co., Ltd.) (Column 3)
  TSKgel G5000H$_{XL}$ (Tohso Co., Ltd.) (Column 4)
  Guard column H$_{XL}$-H (Tohso Co., Ltd.) (Column 6)
Connection of columns: A system connected in the order of (Column 6), (Column 4), (Column 3), (Column 2) and (Column 1) was used.
Detector: R1 (Differential refractometer)
Data processing: Multi-station 8020 (Tohso Co., Ltd.)
Preparation of Standard Polystyrene: Samples Each weighing 10 mg were taken up respectively from 5 or 6 kinds of standard polystyrene differing in molecular weight from each other and dissolved respectively in 100 mL of tetrahydrofuran (hereinafter referred to as THF). The dissolution was conducted at a temperature of 20° C. and then left to stand for 24 hours before use.
Preparation of Samples: Samples Each Weighing 80 mg were taken up respectively and dissolved in 20 mL of THF.
Conditions for the measurement:
Temperature of columns: 40° C.
Solvent: THF
Flow rate: 1 mL/min.
Amount injected of samples: 100 μL Synthesis Example 1

Polymer Composition 1

1,540 parts of propyleneglycol monomethylether acetate (hereinafter referred to as PGMAc) were introduced into a four-necked flask equipped with a stirrer, a thermometer, a cooling tube and a nitrogen-introducing tube. After the PGMAc was heated up to 110° C. under a nitrogen gas stream, a mixed solution consisting of 950 parts of benzyl methacrylate, one part of methacrylic acid, 49 parts of acrylic acid and 100 parts of t-butylperoxy-2-ethylhexanoate (hereinafter referred to as TBPEH) was added drop-wise to the PGMAc taking 4 hours. After finishing the addition of the mixed solution, the resultant mixture was subjected to reaction for hours at 110° C., thereby obtaining a solution of polymer containing 40% of nonvolatile matters and having a weight average molecular weight of 4,296. This polymer composition will be referred to as Polymer composition 1.

Synthesis Example 2

Polymer Composition 2

1,520 parts of PGMAc were introduced into the same kind of four-necked flask as employed in Synthesis Example 1. After the PGMAc was heated up to 135° C. under a nitrogen gas stream, a mixed solution consisting of 950 parts of benzyl methacrylate, one part of methacrylic acid, 49 parts of acrylic acid, 30 parts of TBPEH and 2 parts of di-t-butylperoxide was added drop-wise to the PGMAc taking 5 hours.

After finishing the addition of the mixed solution, the resultant mixture was subjected to reaction for 2 hours at 135° C. and then for 5 hours at 120° C., thereby obtaining a solution of polymer containing 40% of nonvolatile matters and having a weight average molecular weight of 7,029. This polymer composition will be referred to as Polymer composition 2.

Synthesis Example 3

Polymer Composition 3

1,540 parts of PGMAc were introduced into the same kind of four-necked flask as employed in Synthesis Example 1. After the PGMAc was heated up to 110° C. under a nitrogen gas stream, a mixed solution consisting of 870 parts of benzyl methacrylate, 130 parts of methacrylic acid and 30 parts of TBPEH was added drop-wise to the PGMAc taking 4 hours.

After finishing the addition of the mixed solution, the resultant mixture was subjected to reaction for 9 hours at 110° C., thereby obtaining a solution of polymer containing 40% of nonvolatile matters and having a weight average molecular weight of 10,568. This polymer composition will be referred to as Polymer composition 3.

Synthesis Example 4

Polymer Composition 4

1,540 parts of PGMAc were poured into the same kind of four-necked flask as employed in Synthesis Example 1. After the PGMAc was heated up to 110° C. under a nitrogen gas stream, a mixed solution consisting of 870 parts of benzyl methacrylate, 130 parts of methacrylic acid and 100 parts of TBPEH was added drop-wise to the PGMAc taking 4 hours.

After finishing the addition of the mixed solution, the resultant mixture was subjected to reaction for 9 hours at 110° C., thereby obtaining a solution of polymer containing 40% of nonvolatile matters and having a weight average molecular weight of 4327. This polymer composition will be referred to as Polymer composition 4.

Synthesis Example 5

Polymer Composition 5

1,540 parts of cyclohexanone were introduced into the same kind of four-necked flask as employed in Synthesis Example 1. After the Cyclohexanone was heated up to 110° C. under a nitrogen gas stream, a mixed solution consisting of 950 parts of benzyl methacrylate, 50 parts of methacrylic acid and 100 parts of TBPEH was added drop-wise to the cyclohexanone taking 4 hours.

After finishing the addition of the mixed solution, the resultant mixture was subjected to reaction for 8 hours at 110° C., thereby obtaining a solution of polymer containing 40% of nonvolatile matters and having a weight average molecular weight of 4,173. This polymer composition will be referred to as Polymer composition 5.

Synthesis Example 6

Polymer Composition 6

1,540 parts of PGMAc were introduced into the same kind of four-necked flask as employed in Synthesis Example 1. After the cyclohexanone was heated up to 110° C. under a nitrogen gas stream, a mixed solution consisting of 950 parts of benzyl methacrylate, 50 parts of methacrylic acid and 30 parts of TBPEH was added drop-wise to the PGMAc taking 4 hours.

After finishing the addition of the mixed solution, the resultant mixture was subjected to reaction for 9 hours at 110° C., thereby obtaining a solution of polymer containing 40% of nonvolatile matters and having a weight average molecular weight of 10,097. This polymer composition will be referred to as Polymer composition 6.

Synthesis Example 7

Polymer Composition 7

1,540 parts of PGMAc were introduced into the same kind of four-necked flask as employed in Synthesis Example 1. After the cyclohexanone was heated up to 110° C. under a nitrogen gas stream, a mixed solution consisting of 950 parts of benzyl methacrylate, 50 parts of methacrylic acid and 22 parts of TBPEH was added drop-wise to the PGMAc taking 4 hours.

After finishing the addition of the mixed solution, the resultant mixture was subjected to reaction for 9 hours at 110° C., thereby obtaining a solution of polymer containing 40% of nonvolatile matters and having a weight average molecular weight of 12,822. This polymer composition will be referred to as Polymer composition 7.

Synthesis Example 8

Polymer Composition 8

1,540 parts of PGMAc were introduced into the same kind of four-necked flask as employed in Synthesis Example 1. After the cyclohexanone was heated up to 110° C. under a nitrogen gas stream, a mixed solution consisting of 870 parts of benzyl methacrylate, 130 parts of methacrylic acid and 20 parts of t-amylperoxy-2-ethylhexanoate was added drop-wise to the PGMAc taking 4 hours.

After finishing the addition of the mixed solution, the resultant mixture was subjected to reaction for 9 hours at 110° C., thereby obtaining a solution of polymer containing 40% of nonvolatile matters and having a weight average molecular weight of 14,000. This polymer composition will be referred to as Polymer composition 8.

Synthesis Example 9

Polymer Composition 9

1,540 parts of PGMAc were poured into the same kind of four-necked flask as employed in Synthesis Example 1. After the cyclohexanone was heated up to 110° C. under a nitrogen gas stream, a mixed solution consisting of 870 parts of benzyl methacrylate, one part of methacrylic acid, 129 parts of acrylic acid and 100 parts of TBPEH was added drop-wise to the PGMAc taking 4 hours. After finishing the addition of the mixed solution, the resultant mixture was subjected to reaction for 9 hours at 110° C., thereby obtaining a solution of polymer containing 40% of nonvolatile matters and having a weight average molecular weight of 4,670. This polymer composition will be referred to as Polymer composition 9.

Synthesis Example 10

Polymer Composition 10

1,520 parts of PGMAc were introduced into the same kind of four-necked flask as employed in Synthesis Example 1. After the PGMAc was heated up to 135° C. under a nitrogen gas stream, a mixed solution consisting of 960 parts of benzyl methacrylate, 40 parts of methacrylic acid, 30 parts of TBPEH and 2 parts of di-t-butylperoxide was added drop-wise to the PGMAc taking 5 hours.

After finishing the addition of the mixed solution, the resultant mixture was subjected to reaction for 2 hours at 135° C. and then for 6 hours at 125° C., thereby obtaining a solution of polymer containing 40% of nonvolatile matters and having a weight average molecular weight of 7,513. This polymer composition will be referred to as Polymer composition 10.

The results obtained are shown in the following Table 1.

TABLE 1

| | Content of first vinyl monomer having benzyl (mol %/solid matter of resin) | Solvents | Weight average molecular weight | Acid value of solid matters |
| --- | --- | --- | --- | --- |
| Polymer composition 1 | 88.6 | PGMAc | 4,296 | 39.4 |
| Polymer composition 2 | 88.6 | PGMAc | 7,029 | 41.6 |
| Polymer composition 3 | 76.6 | PGMAc | 10,568 | 81.0 |
| Polymer composition 4 | 76.6 | PGMAc | 4,327 | 82.5 |
| Polymer composition 5 | 90.3 | Cyclohexanone | 4,173 | 31.1 |
| Polymer composition 6 | 90.3 | PGMAc | 10,097 | 33.3 |
| Polymer composition 7 | 90.3 | PGMAc | 12,822 | 33.2 |
| Polymer composition 8 | 76.6 | PGMAc | 14,000 | 82.5 |
| Polymer composition 9 | 73.3 | PGMAc | 4,670 | 94.2 |
| Polymer composition 10 | 92.1 | PGMAc | 7,513 | 27.9 |

Preparation of Pigment Dispersion

Preparation Example 1

20 parts of a mixture of C.I. Pigment Red 254/C.I. Pigment Red 177 (weight ratio: 80/20) as a coloring agent, 5 parts (calculated as a solid matter) of BYK-2001 as a dispersing agent, and 75 parts of propylene glycol monomethylether acetate as a solvent were treated in a beads mill to prepare a pigment dispersion (R).

Preparation Example 2

20 parts of a mixture of C.I. Pigment Green 36/C.I. Pigment Yellow 150 (weight ratio: 50/50) as a coloring agent, 5 parts (calculated as a solid matter) of SOLSPERSE-24000 as a dispersing agent, and 75 parts of propylene glycol monomethylether acetate as a solvent were treated in a beads mill to prepare a pigment dispersion (G).

Preparation Example 3

20 parts of a mixture of C.I. Pigment Blue 15:6/C.I. Pigment Violet 23 (weight ratio: 96/4) as a coloring agent, 5 parts (calculated as a solid matter) of Ajisper PB-821 as a dispersing agent, and 75 parts of propylene glycol monomethylether acetate as a solvent were treated in a beads mill to prepare a pigment dispersion (B).

Example 1

A blue color composition to be used for manufacturing a color filter according to the following procedures was prepared.

<Blue Color Composition>

A mixture having the following composition was agitated to obtain a uniform mixture and then the resultant mixture was filtered using a 5 μm-mesh filter to obtain Blue color composition 1.

| | |
| --- | --- |
| Above-described pigment dispersion (B) | 42 parts |
| Polymer composition 1 | 10 parts |
| Trimethylolpropane triacrylate | 4.8 parts |
| Photopolymerization initiator ("IRGACURE-369", Ciba-Geigy Co., Ltd.) | 2.8 parts |

-continued

| | |
| --- | --- |
| Photo-sensitizer ("EAB-F", Hodogaya Kagaku Co., Ltd.) | 0.2 part |
| Cyclohexanone | 40.2 parts |

Examples 2 to 8, Comparative Examples 1 to 6

The color compositions 2 to 14 were obtained by repeating the same procedure as described in Example 1 except that the pigment dispersion and the resin contained in the color composition were replaced by the pigment dispersions and the resins described in the following Table 2. Incidentally, the color compositions of Comparative Examples 7 to 9 (the color compositions 15 to 17) were those which did not contain the copolymers to be used in the present invention.

TABLE 2

|  | | Pigment dispersion | Polymer composition in color composition |
|---|---|---|---|
| Ex. 1 | Color composition 1 | B | Polymer composition 1 |
| Ex. 2 | Color composition 2 | B | Polymer composition 2 |
| Ex. 3 | Color composition 3 | B | Polymer composition 3 |
| Ex. 4 | Color composition 4 | B | Polymer composition 4 |
| Ex. 5 | Color composition 5 | B | Polymer composition 5 |
| Ex. 6 | Color composition 6 | B | Polymer composition 6 |
| Ex. 7 | Color composition 7 | G | Polymer composition 1 |
| Ex. 8 | Color composition 8 | R | Polymer composition 1 |
| Comp. Ex. 1 | Color composition 9 | B | Polymer composition 7 |
| Comp. Ex. 2 | Color composition 10 | B | Polymer composition 8 |
| Comp. Ex. 3 | Color composition 11 | B | Polymer composition 9 |
| Comp. Ex. 4 | Color composition 12 | B | Polymer composition 10 |
| Comp. Ex. 5 | Color composition 13 | G | Polymer composition 7 |
| Comp. Ex. 6 | Color composition 14 | R | Polymer composition 7 |
| Comp. Ex. 7 | Color composition 15 | R | — |
| Comp. Ex. 8 | Color composition 16 | G | — |
| Comp. Ex. 9 | Color composition 17 | B | — |

The color compositions according to the aforementioned Examples and Comparative Examples were evaluated by measuring the following characteristics.

1. Assessment of Long-Term Storage Stability

The initial viscosity of a green color composition which was prepared the day before and the aged viscosity of the same green color composition which was aged for one week at 40° C. were measured by making use of an E-type viscometer (ELD type viscometer, Toki Sangyo Co., Ltd.) under the conditions of: 25° C. in temperature and 20 rpm in revolving speed. Based on the values of the initial viscosity and of the aged viscosity, the rate of change of the viscosity with time was calculated.

[Rate of change of the viscosity with time]=|{(initial viscosity)−(aged viscosity)}/(initial viscosity)|× 100

The assessment of the long-term storage stability was performed based on the following standard.

○: 10% or less in the rate of change of the viscosity with time

Δ: More than 10% and not more than 20% in the rate of change of the viscosity with time X: More than 20% in the rate of change of the viscosity with time

2. Retardation in Thickness Direction (Rth)

Each of color layers was manufactured according to the following procedure and the values of retardation in thickness direction were measured.

By means of spin coating, each of color resists shown in above Table 2 was coated on the surface of a glass substrate and then pre-baked for 20 minutes in a clean oven at a temperature of 70° C. Then, after being cooled to room temperature, the substrate was exposed to ultraviolet rays by making use of an ultra-high pressure mercury lamp. Thereafter, the resultant substrate was subjected to spray development by making use of an aqueous solution of sodium carbonate heated up to 23° C., after which the resultant substrate was washed with ion-exchanged water and air-dried. Subsequently, the resultant substrate was post-baked for 30 minutes in a clean oven at a temperature of 230° C., thereby forming a colored coated film of each of colors. The film thickness as dried of the coated film was 1.8 μm in every case.

The values of retardation in thickness direction were determined as follows. Namely, by making use of a retardation in thickness direction measuring apparatus ("RETS-100"; Ohtsuka Denshi Co., Ltd.), the retardation Δ(λ) of the color layer was measured from the direction which was angled by 45° from the normal direction of substrate having the color layer formed thereon. Then, by making use of this value, the three-dimensional refractive index was calculated and, based on this three-dimensional refractive index, the value Rth of retardation in thickness direction was calculated according to the following equation (1). In this case, a wavelength of 610 nm was used for the red color layer, a wavelength of 550 nm was used for the green color layer, and a wavelength of 450 nm was used for the blue color layer.

$$Rth=\{(Nx+Ny)/2-Nz\}\times d \quad (1)$$

(wherein Nx is a refractive index in the direction of x in the plane of color layer; Ny is a refractive index in the direction of y in the plane of color layer; and Nz is a refractive index in the thickness-wise direction of color layer; x being defined as a slow axis represented by Nx≧Ny; and d is a thickness (nm) of color layer.

The following Table 3 illustrates the value Rth of retardation in thickness direction of each of color layers which were manufactured by making use of each of color resists shown in above Table 2. As the value Rth of retardation in thickness direction of the retardation plate and liquid crystal material to be used in a liquid crystal display device was combined with the value Rth of retardation in thickness direction of the color layer, if it was aimed to minimize the black discoloration of a liquid crystal display device at the off state as it is viewed obliquely, the value Rth of retardation in thickness direction of each of color layers was: +1 nm to −8 nm in the case of a red film, +0 nm to −10 nm in the case of a green film, and +1 nm to −8 nm in the case of a blue film.

The retardation in thickness direction value of the color layer was evaluated according to the following standard.

○: The retardation in thickness direction value was confined to +1 nm to −8 nm in the case of a red film, +0 nm to −10 nm in the case of a green film, and +1 nm to −8 nm in the case of a blue film.

x: The retardation in thickness direction value was confined to these ranges.

The results of above assessment are shown in the following Table 3.

3. Assessment of Patterning Properties

The patterning properties of each of color compositions shown in above Table 2 were evaluated as described below.

Namely, at first, by means of spin coating, each of the color compositions was coated on the surface of a glass substrate and then prebaked at 70° C. for 15 minutes, thereby forming a coated film having a film thickness of 2.3 μm. Then, by means of proximity exposure system using ultraviolet ray as an exposure light source, ultraviolet exposure was performed through a photomask provided with a fine line pattern of 50 μm. The dosage of exposure was set to eight levels, i.e. 30 J/cm$^2$, 40 J/cm$^2$, 50 J/cm$^2$, 60 J/cm$^2$, 70 J/cm$^2$, 80 J/cm$^2$, 90 J/cm$^2$ and 100 J/cm$^2$.

Then, by making use of 1.25 wt % sodium carbonate, the coated film was shower-developed and then washed. The resultant coated film was then subjected to a heat treatment for 20 minutes at 230° C., thus accomplishing the patterning of the coated film.

The film thickness of the filter segment thus obtained was divided by the film thickness (2.3 μm) of the non-exposure/ non-developing portion, thereby calculating the residual film ratio thereof. Then, an exposure sensitivity curve was plotted in a graph with the abscissa representing exposure dosages and the ordinate thereof representing residual film ratios after the development. Based on the exposure sensitivity curve thus obtained, the minimum quantity of exposure which enabled the residual film ratio to keep 80% or more was defined as a saturated exposure dosage. Then, based on the saturated exposure dosage, an appropriate quantity of exposure was determined. Then, each of color layers was irradiated with this appropriate quantity of exposure, thereby performing the assessment of patterning properties according to the following standard.

◯: Developing velocity was appropriate and it was possible to form a normal pattern without peeling of pattern or failure of shape Δ: Developing velocity was inclined to become slightly high or slow and the peeling or shape failure was recognized partially in the pattern.

x: Developing velocity was not appropriate and peeling of pattern or failure of shape was frequently recognized.

5. Assessment of Resistance to Chemicals

In the same manner as in the case of the above assessment of patterning properties, a stripe pattern was formed on the surface of glass substrate and then the glass substrate was exposed to the following conditions. Any change in external appearance of the pattern after this exposure was observed by means of an optical microscope.

N-methyl-2-pyrolidone solvent: Immersed for 30 minutes (24° C.)

Isopropyl alcohol solvent: Immersed for 30 minutes (24° C.)

γ-butyrolactone solvent: Immersed for 30 minutes (24° C.)

The resistance to chemicals was performed according to the following standard.

◯: No change in external appearance under every conditions x: Failures such as peeling of pattern, chips or cracks were recognized.

The aforementioned results are shown in the following Table 3.

It will be recognized from the above Table 3 that the resin compositions of Examples 1 to 8 wherein polymer compositions falling within the scope of the present invention were employed were all excellent in every respects including not only the long-term storage stability, sensitivity and patterning properties of the photosensitive resin composition but also the retardation in thickness direction and chemical resistance of the color layer to be obtained through the curing of the photosensitive resin composition.

Whereas, in the case of the resin compositions of Comparative Examples 1 to 9 wherein polymer compositions falling outside the scope of the present invention were employed, it will be recognized that at least any one of the aforementioned features was found unsatisfactory.

Example 9

6. Manufacture of Color Filter

The color filters were manufactured through a combination of color compositions shown in above Table 3 and by making use of the method described below.

First of all, by means of spin coating, a color composition 8 formed of a photosensitive red color composition was coated on the surface of a glass substrate having a black matrix formed thereon in advance and then pre-baked for 20 minutes in a clean oven at a temperature of 70° C. Then, after being cooled to room temperature, the substrate was exposed, through a photomask, to ultraviolet rays by making use of an ultra-high pressure mercury lamp.

Thereafter, the resultant substrate was subjected to spray development by making use of an aqueous solution of sodium carbonate heated up to 23° C., after which the resultant substrate was washed with ion-exchanged water and air-dried. Further, the resultant substrate was post-baked for 30 minutes in a clean oven at a temperature of 230° C., thereby forming a red colored pixel having stripe-like configuration on the substrate.

Then, by making use of a color composition 7 formed of a photosensitive green composition, a green pixel was formed in the same manner as described above and, further, by making use of a color composition formed of a photosensitive blue composition, the blue pixel was formed in the same

TABLE 3

| | Unit | Long-term storage stability | Phase difference in thickness direction Rth (nm) | Assessment on patterning property/developing speed/adhesion | | Resistance |
|---|---|---|---|---|---|---|
| Ex. 1 | Color composition 1 | ◯ | −5 | ◯ | ◯ | ◯ |
| Ex. 2 | Color composition 2 | ◯ | −4 | ◯ | ◯ | ◯ |
| Ex. 3 | Color composition 3 | ◯ | 0 | ◯ | ◯ | ◯ |
| Ex. 4 | Color composition 4 | ◯ | −2 | ◯ | ◯ | ◯ |
| Ex. 5 | Color composition 5 | ◯ | −3 | ◯ | ◯ | ◯ |
| Ex. 6 | Color composition 6 | ◯ | 1 | ◯ | ◯ | ◯ |
| Ex. 7 | Color composition 7 | ◯ | −4 | ◯ | ◯ | ◯ |
| Ex. 8 | Color composition 8 | ◯ | −2 | ◯ | ◯ | ◯ |
| Comp. Ex. 1 | Color composition 9 | X | 1 | ◯ | X | ◯ |
| Comp. Ex. 2 | Color composition 10 | X | 4 | X | X | Δ |
| Comp. Ex. 3 | Color composition 11 | X | 5 | X | Δ | X |
| Comp. Ex. 4 | Color composition 12 | X | −2 | ◯ | Δ | Δ |
| Comp. Ex. 5 | Color composition 13 | X | 3 | X | X | Δ |
| Comp. Ex. 6 | Color composition 14 | X | 5 | X | X | Δ |
| Comp. Ex. 7 | Color composition 15 | ◯ | 8 | X | ◯ | ◯ |
| Comp. Ex. 8 | Color composition 16 | ◯ | 6 | X | ◯ | ◯ |
| Comp. Ex. 9 | Color composition 17 | ◯ | 6 | X | ◯ | ◯ | manner as described above, thereby obtaining a color filter. The film thickness of each of these colored pixels was 2.0 μm in every case.

7. Manufacture of a Liquid Crystal Display Device

An over-coat layer was formed on the surface of color filter obtained as described above and then a polyimide alignment layer was formed thereon. Further, a polarizing plate was formed on the opposite surface of the glass substrate. On the other hand, a TFT array and pixel electrodes were formed on one surface of another (second) glass substrate and a polarizing plate was formed on the opposite surface of this glass substrate.

A couple of glass substrates thus prepared were positioned face to face so as to make the electrode layers thereof face to each other. Then, these glass substrates were aligned with each other while securing a predetermined gap between these substrates by making use of spacer beads and then the outer circumference of this composite structure of substrates was entirely sealed while leaving an opening for injecting a liquid crystal composition. Thereafter, a liquid crystal composition for VA was injected, via the opening, into the gap and then the opening was closed. The polarizing plate was furnished with an optical compensation layer which was optimized so as to realize a wide viewing angle display.

The liquid crystal display device thus manufactured was assembled with a back light unit to obtain a liquid crystal panel of VA display mode.

Example 10, Comparative Examples 10 and 11

A color filter 2 was manufactured in the same manner as described in Example 9 except that a color composition 2 was employed as the photosensitive blue composition. Then, by making use of this color filter 2, a liquid crystal panel of VA display mode was manufactured in the same manner as described in Example 9 (Example 10).

Further, a color filter 3 was manufactured in the same manner as described in Example 9 except that a color composition 14 was employed as the photosensitive red composition, a color composition 13 was employed as the photosensitive green composition and a color composition 11 was employed as the photosensitive blue composition. Then, by making use of this color filter 3, a liquid crystal panel of VA display mode was manufactured in the same manner as described in Example 9 (Comparative Example 10).

Further, a color filter 4 was manufactured in the same manner as described in Example 9 except that a color composition 14 was employed as the photosensitive red composition, a color composition 13 was employed as the photosensitive green composition and a color composition 9 was employed as the photosensitive blue composition. Then, by making use of this color filter 4, a liquid crystal panel of VA display mode was manufactured in the same manner as described in Example 9 (Comparative Example 11).

8. Assessment of Visibility of Liquid Crystal Display Device on Displaying Black Color The liquid crystal display device manufactured as described above was operated so as to display black color and the quantity of the light leaked out from the liquid crystal panel (orthogonally permeated light; leaked light) in the normal direction (approximately vertical direction) of liquid crystal panel and in a slanted direction which was inclined by 45° from the normal direction (oblique angle) was visually observed. Further, the chromaticity as the panel was viewed in approximately vertical direction at the time of black display (u(⊥), v(⊥)) and the chromaticity as the panel was viewed obliquely by an angle of up to 60° in maximum from the normal direction (u(45), v(45)) were measured by making use of BM-5A (Topcon Co., Ltd.). Then, the color difference Δu'v' was calculated and the maximum value of Δu'v' under the condition of $0 \leqq \theta \leqq 60°$ was determined. The ranking of assessment was as follows, the results being illustrated in the following Table 4.

○: Δu 'v' ≦0.05
x: Δu 'v' >0.05

TABLE 4

| | Color filter used | Photosensitive composition used | | | Visibility assessment/ oblique staining |
|---|---|---|---|---|---|
| | | Red | Green | Blue | |
| Ex. 9 | Color filter 1 | Color composition 8 | Color composition 7 | Color composition 1 | ○ |
| Ex. 10 | Color filter 2 | Color composition 8 | Color composition 7 | Color composition 2 | ○ |
| Comp. Ex. 10 | Color filter 3 | Color composition 14 | Color composition 13 | Color composition 9 | X |
| Comp. Ex. 11 | Color filter 4 | Color composition 14 | Color composition 13 | Color composition 11 | X |

It will be recognized from above Table 4 that since the liquid crystal panels of Examples 9 and 10 were constructed in such a manner that the retardation in thickness direction values of red color pixels, green color pixels and blue color pixels fall within the range of +1 nm to −10 nm, it was possible, through the application of the color filter thus obtained to a liquid crystal display device, to obtain a liquid crystal display device which is excellent in oblique visibility.

Whereas, in the case of the liquid crystal panels of Comparative Examples 10 and 11, since the red color pixels, green color pixels and blue color pixels of the color filter were created by making use of color compositions which fall outside of the present invention, the balance of retardation in thickness direction among the red pixel, the green pixel and blue pixel was poor, so that color shift was caused to generate in the oblique direction, thus deteriorating the oblique visibility thereof.

What is claimed is:

1. A photo-sensitive color composition for a color filter comprising:
    an acrylic resin containing a copolymer formed of a first vinyl monomer having a benzyl group and a second vinyl monomer having a carboxyl group, the first vinyl monomer having a function of regulating a retardation of a color layer obtained by curing of the color composition, the copolymer having a weight average molecular weight of 3,000 to 11,000, and an acid value of solid matter of the copolymer being confined to 30 to 85, and a content of the first vinyl monomer being confined to 76 to 91 mol % based on the solid matters of acrylic resin;

a coloring agent;
a resin exhibiting a permeability of not less than 80% in a total wavelength range of 400 to 700 nm of visible light zone;
a photopolymerizable monomer; and
a photo-polymerization initiator.

2. The photo-sensitive color composition for a color filter according to claim 1, wherein the first vinyl monomer is selected from the group consisting of benzyl acrylate and benzyl methacrylate, and the second vinyl monomer is selected from the group consisting of acrylic acid, methacrylic acid, maleic acid, monoalkyl maleic acid, fumaric acid, monoalkyl fumaric acid, itaconic acid, monoalkyl itaconic acid, crotonic acid, maleic anhydride, itaconic anhydride and 2-methacryloyl propionic acid.

* * * * *

UNITED STATES PATENT AND TRADEMARK OFFICE
CERTIFICATE OF CORRECTION

| | |
|---|---|
| PATENT NO. | : 8,262,946 B2 |
| APPLICATION NO. | : 12/662972 |
| DATED | : September 11, 2012 |
| INVENTOR(S) | : Mie Shimizu et al. |

It is certified that error appears in the above-identified patent and that said Letters Patent is hereby corrected as shown below:

First Page Col. 1 (Assignees), Line 2, Delete "Corportion," and insert -- Corporation, -- therefor.

Signed and Sealed this
Twenty-fifth Day of December, 2012

David J. Kappos
*Director of the United States Patent and Trademark Office*